(12) United States Patent
Kliner et al.

(10) Patent No.: US 8,593,725 B2
(45) Date of Patent: Nov. 26, 2013

(54) PULSED OPTICAL SOURCE

(75) Inventors: Dahv Kliner, Mountain View, CA (US);
Martin H. Muendel, Oakland, CA (US);
Loren Eyres, Palo Alto, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 449 days.

(21) Appl. No.: 12/850,504

(22) Filed: Aug. 4, 2010

(65) Prior Publication Data

US 2011/0032605 A1 Feb. 10, 2011

Related U.S. Application Data

(60) Provisional application No. 61/231,288, filed on Aug. 4, 2009.

(51) Int. Cl.
*H01S 5/00* (2006.01)

(52) U.S. Cl.
USPC .......................................... 359/344; 359/337

(58) Field of Classification Search
USPC .......................................... 359/333, 337, 344
See application file for complete search history.

(56) References Cited

U.S. PATENT DOCUMENTS

| | | | | |
|---|---|---|---|---|
| 5,475,529 | A * | 12/1995 | Takatu et al. | 359/341.1 |
| 7,046,349 | B2 * | 5/2006 | Everall et al. | 356/73.1 |
| 7,099,530 | B2 * | 8/2006 | Shin et al. | 385/27 |
| 7,443,893 | B2 | 10/2008 | Murison et al. | 372/26 |
| 7,457,329 | B2 | 11/2008 | Murison et al. | 372/20 |
| 2004/0017603 | A1 * | 1/2004 | Jay et al. | 359/341.4 |
| 2004/0234265 | A1 * | 11/2004 | Shin et al. | 398/79 |
| 2005/0168792 | A1 * | 8/2005 | Dorrer et al. | 359/241 |
| 2008/0181266 | A1 | 7/2008 | Deladurantaye et al. | 372/25 |
| 2009/0003395 | A1 | 1/2009 | Murison et al. | 372/25 |
| 2009/0086773 | A1 | 4/2009 | Murison et al. | 372/20 |
| 2009/0180502 | A1 | 7/2009 | Byun et al. | 372/32 |
| 2009/0296759 | A1 * | 12/2009 | Starodoumov | 372/25 |

FOREIGN PATENT DOCUMENTS

WO 2007139330 12/2007 ............. H04B 10/28

OTHER PUBLICATIONS

"Noise Suppression of Incoherent Light Using a Gain-Saturated SOA: Implications for Spectrum-Sliced WDM Systems", McCoy, et al, Journal of Lightwave Technology, vol. 23, pp. 2399-2409 (2005).

* cited by examiner

*Primary Examiner* — Eric Bolda
(74) *Attorney, Agent, or Firm* — Matthew A. Pequignot; Pequignot + Myers LLC

(57) ABSTRACT

The invention relates to pulsed optical sources formed of a source of seed optical radiation, a pulsed optical amplifier for pulsing the seed optical radiation, and an output optical port for outputting a pulsed optical signal produced by the pulsed optical amplifier. An optically isolating element such as an optical circulator is provided in the optical path between the optical seed source and the pulsed optical amplifier.

13 Claims, 15 Drawing Sheets

PULSED OPTICAL SOURCE

CROSS-REFERENCE TO RELATED APPLICATIONS

The present invention claims priority from U.S. Provisional Patent Application No. 61/231,288 filed Aug. 4, 2009, entitled "Versatile Pulsed Source for Optical Amplification", which is incorporated herein by reference for all purposes.

TECHNICAL FIELD

The present invention generally relates to sources of pulsed optical radiation, a more particularly relates to sources of optical pulses incorporating pulsed optical amplifiers.

BACKGROUND OF THE INVENTION

Pulsed laser sources are used in a variety of applications, including material processing, optical communications and measurements. Diode-pumped solid-state lasers, for example Nd:YAG lasers, have been conventionally used in applications requiring high peak optical power, such as marking, engraving, micro-machining, cutting, and other material-processing applications. Such lasers typically rely on Q-switching and/or mode locking to generate optical pulses and therefore produce optical pulses with characteristics that are predetermined by the cavity geometry, mirror reflectivities, and the like, and cannot generally be easily varied in the field without compromising the laser performance.

An attractive alternative to the solid-state pulsed lasers are pulsed laser systems based on fiber amplifiers (FA), such as an Erbium-doped (ED) fiber amplifier (EDFA). In some applications, EDFA-based laser systems may offer certain advantages over conventional diode-pumped solid-state lasers, such as potentially lower cost, higher efficiency, and higher reliability. Furthermore, FA-based laser systems may enable new applications by providing a combination of operational parameters, such as pulse temporal format, repetition rate, energy, power, etc., that are not accessible with other currently available technologies. Such lasers, however, typically require a seed pulse source for providing, or "seeding" the fiber amplifier with seed optical pulses. In a typical prior art arrangement, a low-power laser diode that is pulsed with the desired repetition rate and pulsewidth acts as a seed for a fiber amplifier or a chain of fiber amplifiers, which increase the pulse power. In such a configuration, the pulse generation process is separated from the amplification process, with both the spectral and temporal quality of the laser output pulses depending only on the laser diode source.

Directly pulsing the laser diode current can however generate transient effects that can disadvantageously affect both the spectrum and the noise level of the seed source. In the case of Fabry-Perot (FP) laser diodes, longitudinal mode beating can lead to high frequency noise which consequently gives rise to peak power fluctuations in the pulse structure, which is a disadvantage. Distributed feedback (DFB) and distributed Bragg reflector (DBR) diode lasers typically generate a single mode in a cw regime, but exhibit frequency chirp when pulsed, so that the laser linewidth depends on the pulse duration. For seeding a high-peak-power fiber amplifier, the source linewidth should be sufficiently broad to suppress stimulated Brillouin scattering (SBS), an undesirable nonlinear process that limits the ability to generate high peak powers in the fiber, particularly for pulse durations of more than about 1 nanosecond (ns); typically a linewidth in excess of 10 GHz is desired. The frequency chirping of the modulated DFB laser does not broaden the linewidth sufficiently to suppress SBS, limiting the use of DFB lasers to pulse duration of less than about 2 ns. In principle, the laser drive current could be modulated to broaden the linewidth, but this approach would significantly complicate the laser drive electronics. Additionally, the DFB and DBR lasers can exhibit mode hopping behaviors under some pulsed drive conditions that may cause undesirable complications in applications that rely on stable-single-frequency output.

U.S. Pat. Nos. 7,443,893, 7,457,329 and U.S. Patent applications 20080181266, 20090003395, 20090086773 disclose pulsed optical sources utilizing a seed source of continuous or quasi-continuous seed light, a continuously operating fiber-optic amplifier and an optical modulator which are coupled in various configurations using an optical circulator. In these designs, the spectral properties of resulting pulses are to some extent de-coupled from the temporal characteristic of the output pulses, as they are controlled by different elements of the pulsed source. Disadvantages of such designs include their relatively high cost and complexity requiring three or more active components, a relatively high noise level compared to semiconductor amplifiers, and drawbacks in performance related to the use of conventional optical modulators, including bias-point drift, limited contrast ratio, and photo-refractive damage.

Accordingly, there is a need to provide a pulsed laser source that would be free of at least some of the deficiencies indicated above, and would be capable of generating optical pulses with flexible, user-selectable temporal and spectral formats and relatively high output power. An object of the present invention is to provide such a pulsed optical source.

SUMMARY OF THE INVENTION

In accordance with the invention, there is provided an optical pulse source, which comprises a seed optical source for providing seed optical radiation, a pulsed optical amplifier (POA) coupled to the seed optical source for amplifying the seed optical radiation in dependence upon an electrical pulse signal applied thereto, and for producing a pulsed optical signal comprising optical pulses of a pulse duration defined by the electrical pulse signal, an optically isolating device disposed in an optical path between the seed optical source and the POA for preventing back reflections into the seed optical source, and an output optical port for outputting the pulsed optical signal. The optical pulse source further includes a POA controller for providing the electrical pulse signal to the pulsed optical amplifier. The pulsed optical signal at the output port has an optical spectral shape that is defined substantially by the seed optical source, and has a temporal pulse shape that is defined substantially by the POA controller.

In accordance with one aspect of this invention, the POA comprises a semiconductor optical amplifier.

In one embodiment, the seed optical source comprises a source of amplified spontaneous emission. In another embodiment, the seed optical source comprises a single-frequency semiconductor laser. In this embodiment, the optical pulse source may further comprise an optical phase modulator coupled in the optical path between the optical seed source and the pulsed optical amplifier.

BRIEF DESCRIPTION OF THE DRAWINGS

The invention will be described in greater detail with reference to the accompanying drawings which represent preferred embodiments thereof, wherein.

DETAILED DESCRIPTION

In the following description, the term "light" is used to refer to electromagnetic radiation, including but not limited to visible light. Furthermore, the term "optical" is used to qualify all electromagnetic radiation, including light in the visible spectrum and light in other wavelength ranges. The terms "optical radiation", "optical signal", and "light" are used herein interchangeably and encompass visible light and non-visible light such as ultraviolet (UV) light and infrared (IR) light.

Exemplary embodiments of an optical pulse source (OPS) according to the present invention are shown in FIGS. 1, 5-10, and are hereafter described.

Figure 1:
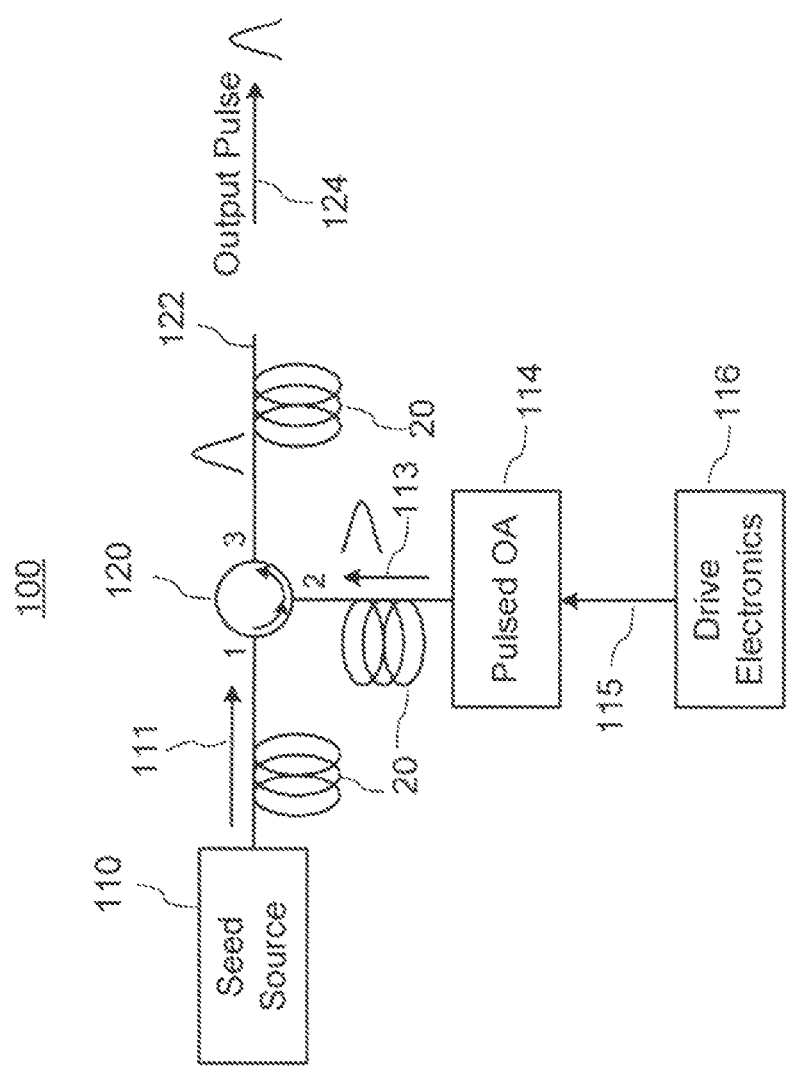
FIG. 1 is a schematic block diagram of an optical pulse source (OPS) according to an embodiment of the present invention.

With reference to FIG. 1, an OPS 100 includes a seed optical source (SOS) 110 for providing seed optical radiation 111, a pulsed optical amplifier (POA) 114 which is optically coupled to the SOS 110 to receive the seed optical radiation 111 for pulsed amplification thereof, and an output optical port 122 which is in turn optically coupled to the POA 114 for providing output radiation thereof to a user. In operation, the POA 114 amplifies the seed optical radiation 111 in dependence upon an electrical pulse signal 115 applied thereto using POA drive electronics 116, also referred to herein as the POA driver 116 or POA controller 116. In particular, the electrical pulse signal 115 from the POA driver 116 modulates optical gain in the POA 114 so as to amplify the seed optical radiation during a short period of time that is referred to herein as the output pulse duration. As a result, the POA 114 produces a pulsed optical signal 113, which is formed of output optical pulses having a pulse profile and the pulse duration defined by the electrical pulse signal 115. The pulsed optical signal 113 is coupled to the output optical port 122 for outputting thereof as the output optical signal 124 to a target application, for example to seed a fiber amplifier. In some embodiments, the POA 114 absorbs the input seed optical radiation 111 immediately before and after the output pulse duration so as to substantially attenuate it to a suitably low level at time intervals outside the output pulse duration. To achieve stronger light suppression outside the output pulse duration, in some embodiments the SOS 110 may be modulated so that the SOS turns on before the output pulse duration and turns off after each output pulse.

According to an aspect of the present invention, the POA 114 has an optical gain which is broader in spectrum than the seed optical radiation 111, so that the spectral profile of the output optical pulses is determined primarily by the optical spectrum of the seed optical radiation 110. In the context of the specification the term "spectral profile", when referred to light such as pulsed optical signal 113 and seed optical radiation 111, means intensity of the light as a function of wavelength; the term "temporal profile" is used herein to refer to the intensity of an optical pulse or pulses as a function of time and defines the width and amplitude shape of the optical pulse or pulses.

The SOS 110 and POA 114 may be embodied using various suitable optical devices, examples of which are described hereinbelow; furthermore, differing coupling configurations of these elements and the output port 122 may be utilized. In one currently preferred embodiment, the SOS 110, POA 114 and output port 122 are coupled using optical waveguides. In the embodiment shown in FIG. 1, optical fibers 20 are used as such optical waveguides to facilitate the transmission of light from the SOS 110 to the POA 114, and then to the output port 122.

Furthermore, in the shown embodiment the POA 114 is a reflective device having a single input/output optical port; an optical circulator 120 having a first input port 1, a second input-output port 2, and a third output port 3 is used to couple the seed optical radiation 111 from the SOS 110 into the POA 114, and to couple the pulsed optical signal 113 from the POA 114 to the output port 122. Advantageously, the optical circulator 120 is a unidirectional device having relatively low optical loss for light propagating from port 1 to port 2, and from port 2 to port 3, but have a high optical loss for light propagating from port 2 to port 1, and from port 3 to port 2, so that it functions as an optical isolator and effectively prevents back reflections from the POA 114 and the output port 122 into the SOS 110. The output port 122 may for example be simply in the form of a fiber end that may be optionally furnished with a suitable fiber-optic connector, or may be spliced to an input fiber of a fiber amplifier.

The SOS 110 may be in the form of any suitable optical source capable of emitting radiation that has desired spectral properties, such as a desired central wavelength, linewidth, spectral shape, a suitably low optical power level at optical frequencies that are outside of a desired optical spectral band, etc., and which can be efficiently coupled into the POA 114 with a sufficient optical power. By way of example, for material processing applications the central wavelength of 1064 nm may be desired. The SOS 110 should provide a desired optical spectrum for at least the duration of the output optical pulse to be generated by the POA 114; accordingly, it may be operated in a continuous wave (cw) regime, or it can be pulsed with a pulse duration at least as long as the pulse duration of the electrical pulse signal 115 driving the POA 114. For example, one may select to pulse the SOS 110 to minimize the optical power of the seed radiation 111 between the output optical pulses in the output pulsed signal 113, when the POA 114 is not operating as an amplifier, i.e. does not amplify optical signals input thereinto. The SOS 110 could be modulated much more slowly than the POA 114 and the electronics driving the SOS 110 could be much slower than the electronics driving the fast pulsed POA 114.

In some embodiments it may be desired that the SOS 110 has a stable output power during the POA optical pulse. Furthermore, the POA 114, when operating in a saturated regime, may be able to suppress, power fluctuations of the seed optical radiation 111 from the SOS 110.

In some embodiments it may be desired that the SOS 110 emits light 111 that has a stable polarization state, such as linear polarized, unpolarized, etc. The SOS 110 may be selected so that its output spectrum, i.e. the optical spectrum of the seed radiation 111, is such as to compensate for any spectral changes induced by the POA 114 or other optical components. Finally, the output spectrum of the SOS 110 may be variable by the user if desired for a given application.

Preferably, the optical circulator 120, or other coupling means that may be used to direct the seed radiation 111 to the POA 114, and the pulsed optical signal 114 to the output port 122, exhibits low optical loss for the light propagating from the SOS 110 to the POA 114, and from the POA 114 to the output port 122, and does not degrade the stability, spectral properties, and/or polarization state of the signal.

The POA 114 may be conveniently embodied as a semiconductor optical amplifier (SOA) and as such is also referred to herein as the SOA 114. It is driven with the electrical pulse signal 115 which may be in the form of a train of electrical pulses or a single electrical pulse that may be triggered "on demand", or as desired for a particular application. Advantageously, the optical gain in a SOA can be easily modulated at high speeds by modulating an electrical drive current passed therethrough, thereby enabling the generation of both long and short optical pulses. During such pulse or pulses, the SOA 114 amplifies the seed light 111 from the SOS 110 without significantly degrading the spectral properties thereof because of a broad and relatively flat spectrum of optical amplification, also known as the optical gain spectrum, in the SOA 114. Furthermore, in embodiments wherein the SOA 114 is operated in a regime wherein its optical gain is saturated by the seed light from the SOS 110, the out-of-band amplified spontaneous emission (ASE) from the SOA 114 is advantageously suppressed, contributing in preserving the spectrum of the seed radiation. Here, the term "out-of-band" refers to spectral regions that are outside of the desired optical spectral band wherein the seed source 114 emits most or all of its radiation. SOAs that are capable of providing an output optical peak power as high as 500 mW (milliwatt) or greater, a modulation bandwidth of about 500 MHz, a double-pass gain of up to about 30 dB, and which can be modulated to provide output optical pulses with duration from as low as about 2 ns to over 100 ns are commercially available.

Figure 2:
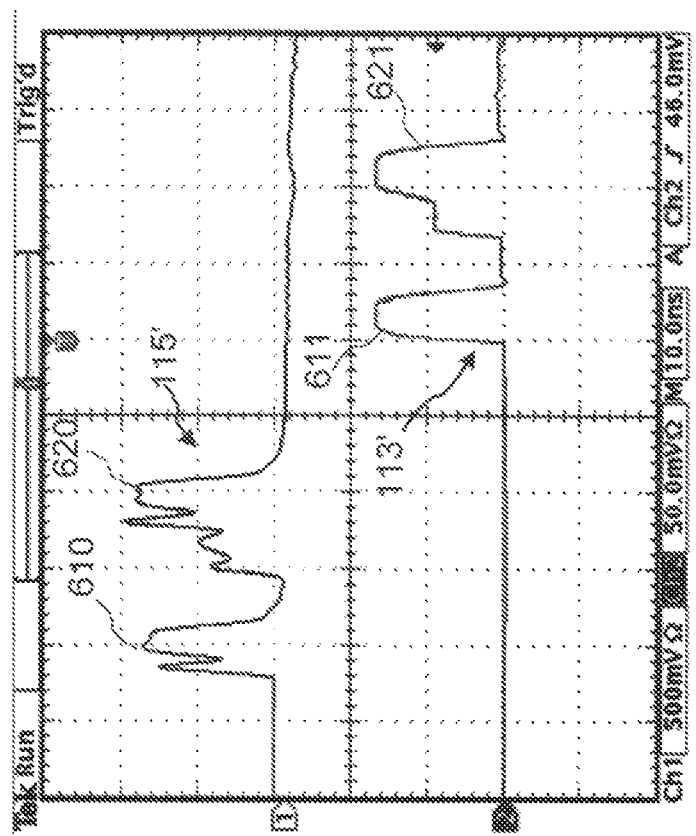
FIG. 2 is a graph illustrating the modulation of a semiconductor optical amplifier (SOA) with short electrical pulses to obtain optical pulses of a target shape.

Although the SOA 114 largely determines the temporal properties of the output optical pulse signal 113, the output optical pulse signal 113 may not be an exact, high-fidelity reproduction of the electrical pulse signal 115; the electrical and optical pulses in the respective pulse signals 115 and 113 may differ because of the electrical response of the SOA package and connections, the electro-optical properties of the SOA 114, and possibly other factors. The electrical pulse signal 115 used to drive the SOA 114 may be tailored, such as in shape, to take into account the response function of the SOA 114, so that the desired output temporal pulse is obtained. By way of example, useful pulse shapes include top hat intensity profiles, Gaussian intensity profiles, chair profiles, i.e. pulses consisting of primarily two different constant intensity levels. Further by way of example, FIG. 2 illustrates the electrical pulse signal 115' having two electrical pulses 610 and 620 spaced by about 20 ns, and a resulting output optical pulse signal 113' with two output optical pulses 611, 621 corresponding to the electrical pulses 610 and 620, respectively. The electrical pulse signal 115' has been pre-compensated, or pre-shaped, for the electrical response of the SOA 114 chip to yield the two optical pulses 611, 621 with clean rise and fall without ringing. The temporal profile, or shape, of the second optical pulse 621 is chair-like with two different intensity levels held for some duration. Note that for clarity of the depiction, in FIG. 2 there is an additional time offset of about 40 ns in the optical output signal 113' relative to the electrical signal 115'.

When the electrical pulse signal 115 is in the form of a periodic sequence of electrical pulses with a repetition rate R, the output optical pulse signal is also in the form of a periodic sequence of optical pulses with the same repetition rate R. Generally, the SOA 114 can be driven with electrical pulses at any desired interval, for example at a fixed repetition rate, or triggered by pulse bursts, etc., and consecutive electrical pulses in the electrical pulse signal 115 may be identical or they may differ from each other, depending on a desired temporal waveform of the output optical pulse signal 113. By way of example, the SOA 114 and its drive electronics 116 supports the repetition rate R that is variable from about 1 kHz or less, to about 10 MHz or higher, which covers a span of pulse repetition rates that is typically considered to be useful for driving a fiber amplifier system.

In one embodiment, the SOS 110 is selected to provide the seed radiation 111 with an output peak power that is sufficiently high so as to cause the SOA to operate in a saturation regime, wherein the output optical power of the SOA 114 is saturated during the electrical pulse 115. In the saturation regime of the SOA, the sensitivity of the output power of the SOA to fluctuations in the seed optical power is reduced, thereby providing an output pulse energy that is more stable than the output power of the SOS 110. By way of example, the SOS 110 may be selected to provide between about 1 mW to about 10 mW of input optical power into the SOA 114, which is sufficient to saturate a conventional double-pass SOA biased to a small-signal gain of 20-30 dB. Accounting for optical losses between the SOS 110 and the SOA 114, such as the optical loss between ports 1 and 2 of the circulator 120 and optical loss in other optional intervening optical elements such as optical modulators as described hereinbelow, the output optical power of the SOS 110 may be in the range from about 1.5-2 mW to a few tens of mW. The SOA 114 may attenuate any light from the SOS 110 that is present outside a time window defined by the electrical driving pulse of the SOA, as illustrated in FIG. 2 wherein light in the output optical signal 114 is substantially absent, or greatly reduced, before and after the time intervals of the pulses 611 and 621, which are defined by the durations of the pulses 610 and 620.

Figure 3:
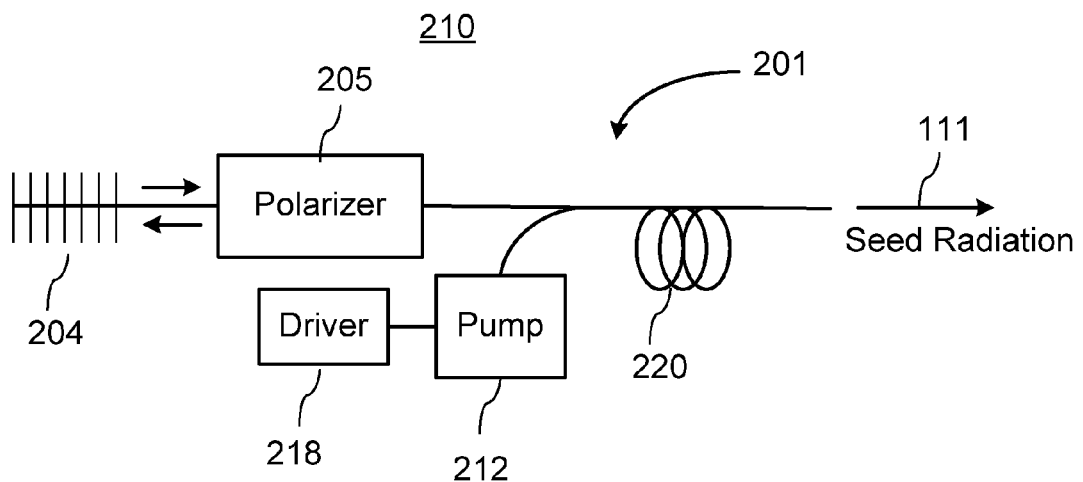
FIGS. 3 to 5 are schematic block diagrams of different embodiments of an ASE source that can be used to seed the OPS of FIG. 1.
Figure 4:
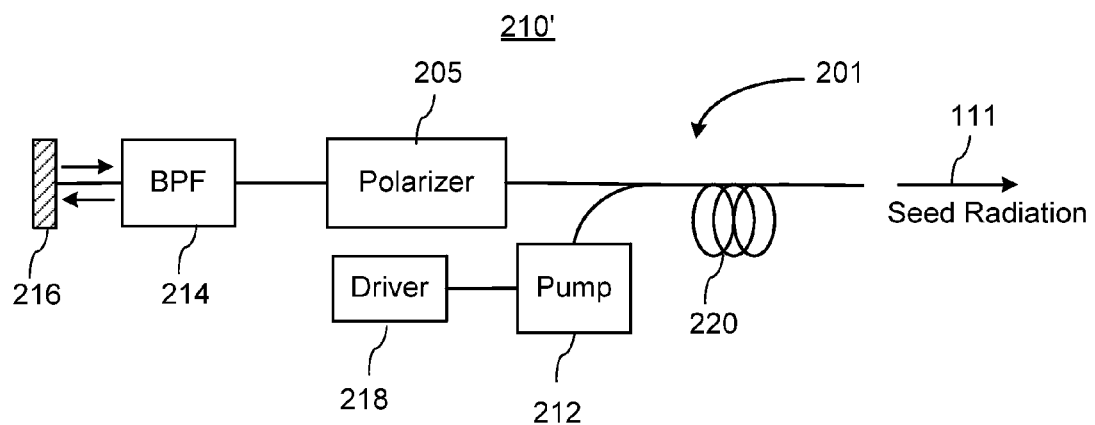
Figure 5:
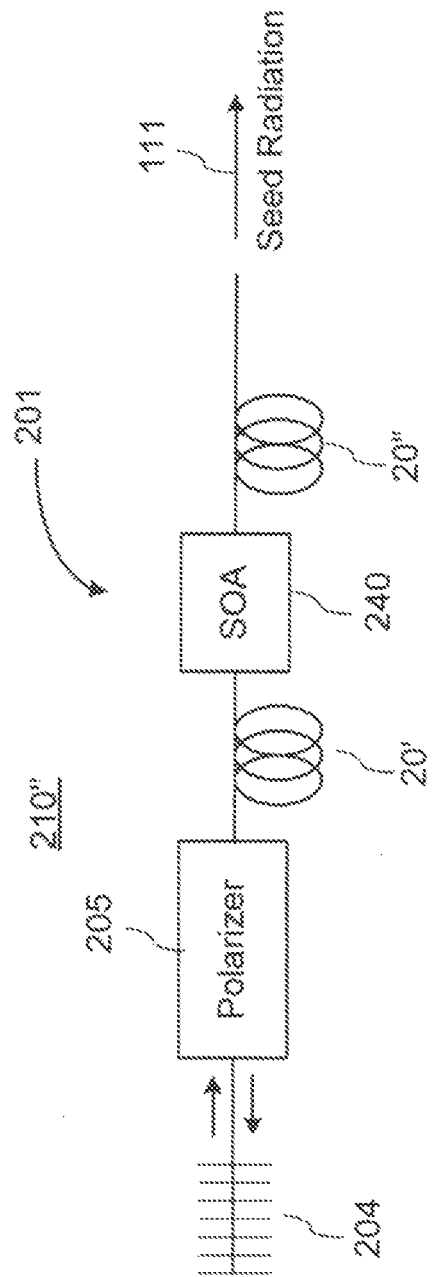

FIGS. 3 to 5 illustrate exemplary designs of an ASE (amplified-spontaneous-emission) source which can be used as the SOS 110 in some embodiments of the invention. It will be appreciated that other embodiments of the SOS 110 are also possible within the scope of the present invention. in which the seed optical radiation 111 is substantially (ASE) generated in a section of a suitably doped optical fiber.

Referring first to FIG. 3, there is schematically shown an ASE source 210 that can be used as the SOS 110. As shown, the ASE source 210 employs an optical amplifier (OA) 201 in the form of a section or sections of suitably doped, for example with rare-earth dopants, fiber 220 that is optically pumped using a suitable optical pump source 212 as known in the art. A pump driver 218 is electrically coupled to the optical pump source 212 for providing electrical energy thereto to generate the pump radiation. By way of example, the doped fiber 220 may be Nd-doped fiber or Yb-doped fiber for operation in the 1030-1080 nm region, or may be Er doped fiber for operation in the 1550 nm region. In another embodiment, the OA 201 may be based on a fiber-coupled SOA. As shown in the figure, the ASE source 210 operates in a double-pass configuration and includes a reflector 204 fiber-coupled at distal end of the OA 201. The reflector 204 may be spectrally selective to provide a desired optical spectrum of the seed radiation 111, and may be embodied using a fiber Bragg grating (FBG) as illustrated in FIG. 3. An optional polarizer 205 may be provided, for example optically coupled between the distal end of the OA 201 and the FBG 204, to facilitate the generation of linearly polarized ASE. In some embodiments wherein linearly polarized ASE radiation is desired, the OA 201 may utilize polarization-maintaining fiber. The FBG reflects a portion of the ASE spectrum generated in the doped fiber 220 back into the OA 201, where it is amplified before being output from the opposite end of the OA 201 in the form of the seed optical radiation 111; the resultant output spectrum is thus determined by the reflection spectrum of the FBG 204.

With reference to FIG. 4, in another embodiment 210' of the ASE source 210, the FBG 204 may be replaced with an optical filter 214, such as a bandpass optical filter, followed by a high-reflecting mirror 216, which together provide the frequency selective feedback function that is similar to that of the FBG 204. The optical pump 212 may be embodied using one or more pump laser diodes (LD) as known in the art, in which case the pump driver 218 may be a conventional pump laser driver for passing an electrical driver current through the pump LD.

With reference to FIG. 5, in another embodiment of the ASE source 210, the OA 201 is shown in the form of a fiber-coupled SOA 240 operating in transmission, with one optical fiber port 20' coupled to the FBG 204 through the optional polarizer 205, and the other optical fiber port 20" serving to output the seed optical radiation 111. In this embodiment, it may be preferable to use polarization-maintaining fiber for coupling between the SOA 240, polarizer 205, and FBG 204.

Advantageously, the seed optical radiation 111 emitted by the ASE sources 210, 210' or 210" has no substantial mode structure, and thus has a smooth and stable optical spectrum and low intensity noise, i.e., relatively small temporal fluctuations of the output power even at a high bandwidth at frequencies of up to several GHz. Furthermore, the noise level of the seed radiation at frequencies up to several GHZ may be further reduced by the SOA 114 when it is operated in the saturated regime. The output spectrum of the ASE 210 (210', 210") may be tunable, for example by stretching, compressing, or varying the temperature of the FBG 204, or by angle-tuning the spectral optical filter 214, or generally by using a tunable frequency-selective optical element within the ASE source 210. In some embodiments, the output of the ASE source 210 (210', 210") may be pre-amplified, e.g., by one or more SOAs (not shown), prior to be coupled into the POA 114.

In other embodiments, the SOS 110 may be in the form of a laser, including but not limited to an FP laser diode, a DFB laser diode, a DBR laser diode, an external cavity laser diode (ECL), a microchip solid-state laser, or a fiber-Bragg-grating-stabilized fiber laser, and may operate in a single longitudinal mode regime or a multiple longitudinal mode regime. Alternatively, the SOS 110 may be in the form of a light emitting diode (LED).

Figure 6:
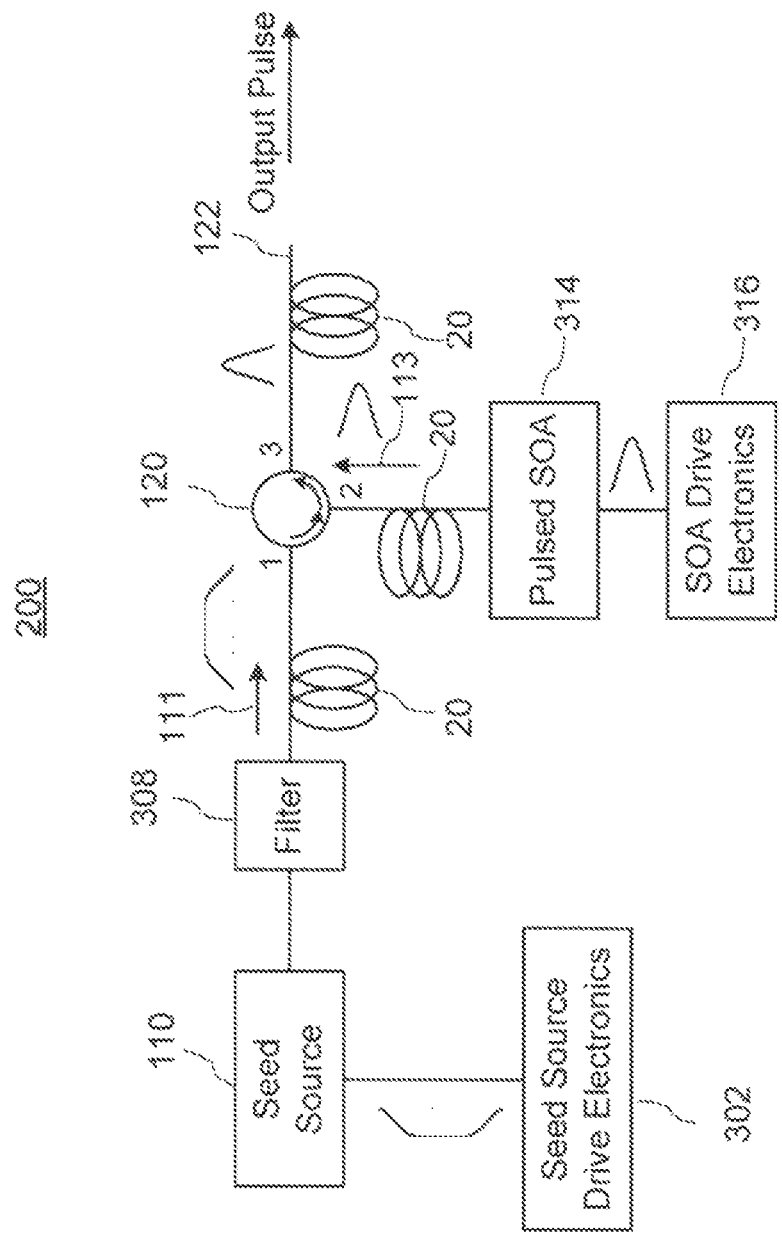
FIG. 6 is a schematic block diagram of an embodiment of the optical pulse source (OPS) of the present invention with a modulated seed source.

With reference to FIG. 6, an OPS 200 is schematically illustrated according to an embodiment of the present invention. The OPS 200 may be viewed as an embodiment of the OPS 100 of FIG. 1, wherein the SOS 110 is driven by an electrical seed source (SS) driver 302, and wherein the POA 114 is embodied as a SOA 314, with the SOA driver 316. In one embodiment, the SOS 110 is in the form of a semiconductor laser diode (LD), and the SS driver 302 and the SOA driver 316 include electrical drive circuitry that is suitable for driving an LD and a SOA, respectively. An LD as the SOS 110 may be conveniently pulsed using simple electronics as known in the art, which would advantageously minimize seed radiation in-between the electrical pulses driving the SOA 314.

In some embodiments, the SOS 110 may be driven by the SS driver 302 with an electrical seed pulse that is longer than the desired output pulse from the SOA 314, allowing the rise and fall times of the electrical pulse signal generated by the SS driver 302 to be greater than the rise and fall times of the electrical pulse signal generated by the SOA driver 316, thereby reducing the demands on the electronics in the SS driver 302, and allowing time for the output spectrum of the SOS 110 to stabilize.

Figure 7:
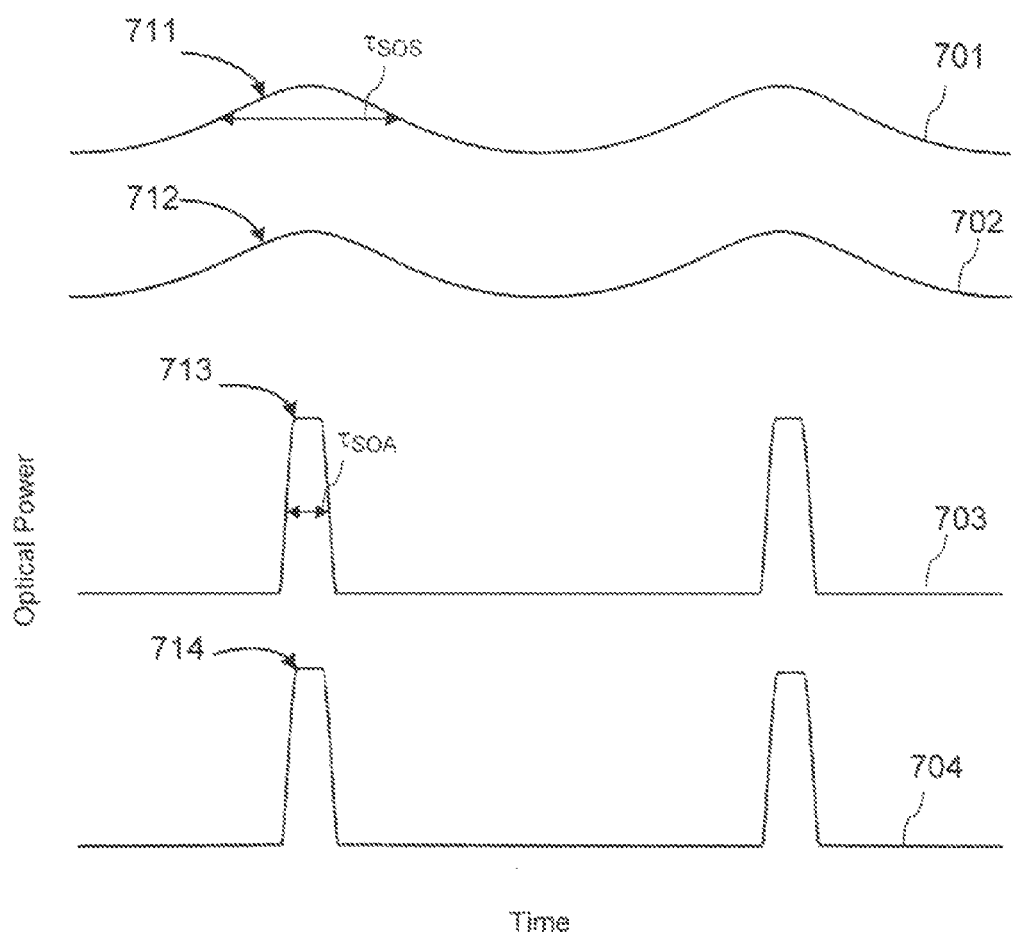
FIG. 7 is a schematic diagram illustrating the pulsing of the seed optical source and of the pulsed OA according to an embodiment of the invention.

Such pulsing scheme is schematically illustrated in FIG. 7; the SS driver 302 generates a seed electrical pulsed signal 701 in the form of a sequence of relatively broad electrical seed pulses 711 with a FWHM seed pulse duration $\tau_{SOS}$. The SOS 110, being driven by the seed electrical pulse signal 701, generates the seed optical radiation 111 with a temporal profile 702 that substantially follows the temporal profile of the seed electrical pulsed signal 701, and is composed of optical seed pulses 712 with a pulse width substantially $\tau_{SOS}$. Simultaneously, the SOA driver 316 generates the SOA electrical pulse signal 115 having a temporal profile 703 and is comprised of electrical pulses 713 that are synchronized with the seed electrical pulses 711, but have a duration $\tau_{SOA}$ that is at least somewhat smaller than the duration of the seed pulses $\tau_{SOS}$, i.e. $\tau_{SOA} < \tau_{SOS}$, with shorter rise and fall times. The temporal profile 704 of the resulting pulsed optical signal 113 generated by the SOA 314 is composed of the output optical pulses 714 having the output pulse duration that is substantially $\tau_{SOA}$, with little or no light being emitted by the SOA 314 in-between the output pulses 714.

Note that the SOS 110 may also be pulsed when embodied as an ASE source, by modulating the pump power of a corresponding OA. Referring back to FIGS. 3 and 4 by way of example, the optical pump source 212 may be a pump LD which output power may be pulse modulated by using a suitably designed pulsed LD driver 218 that is capable of driving the LD pump 212 with pulses of electrical current of the suitable seed pulse duration $\tau_{SOS}$. Alternatively, the SOS 110 may incorporate a cw light source such as an ASE source or a cw LD, followed by an amplitude modulator to form the seed optical pulses 712.

The pulsed SOA 314 may be essentially in the form of a gain region of a diode laser integrated into a fiber-coupled package. In the embodiment shown in the block diagram of FIG. 6, the pulsed SOA 314 is double-passed by use of a high reflector on the back facet thereof. The SOA 314 has a fiber-coupled front facet that may be anti-reflection (AR) coated, including ultra-anti-reflection (UAR) coated, which typically provides a reflectivity on the order of 0.1% or less. The AR or UAR coating serves to minimize any undesirable temporal or spectral effects caused by the low-Q cavity formed by the front and back facets of the SOA; it also minimizes the reflection of seed light back into the fiber without passing through the SOA 314. Double-passing of the SOA 314 maximizes the gain, minimizes transmission of light between the optical pulses, and requires that only one side of the SOA be fiber coupled. Suitable double-pass fiber-coupled SOAs which have a single input/output fiber-optic port and a modulation bandwidth up to at least 500 MHz are commercially available from 3S Photonics SA and Lumics GmbH, and can be used to produce optical pulses as short as about 2 ns with a repetition rate up to over 10 MHz. Preferably, the spectral width $\Delta F_{SS}$ of the seed radiation 111 at the input of the SOA 314 is much smaller than the spectral width $\Delta F_{SOA}$ of the optical gain of the SOA 314, so that the optical gain of the SOA is approximately flat over the spectral band of the seed radiation and does not change its spectrum in a substantive way. By way of example, $\Delta F_{SOA}$ can be in the range from few tens of nanometers to more than a hundred of nanometers, and the $\Delta F_{SS}$ can be in the range of a few nm down to 0.1 nm or less, so that $\Delta F_{SS}$ is at least 3-5 times, and preferably more than 10 times smaller than $\Delta F_{SOA}$.

The OPS 200 may also optionally include an optical filter 308 coupled between the LD seed source 116 and the optical circulator 120, for example to further suppress any out-of band optical radiation that may be emitted by the seed source 110 if that is desired for a particular application.

The embodiments described hereinabove with reference to FIGS. 1 and 6 utilize the optical circulator 120 to couple seed light from a SOS into a POA, and to couple pulsed output light from the POA. However, other embodiments may utilize differing coupling configurations using differing optically isolating elements and coupling means for this purpose.

Figure 8:
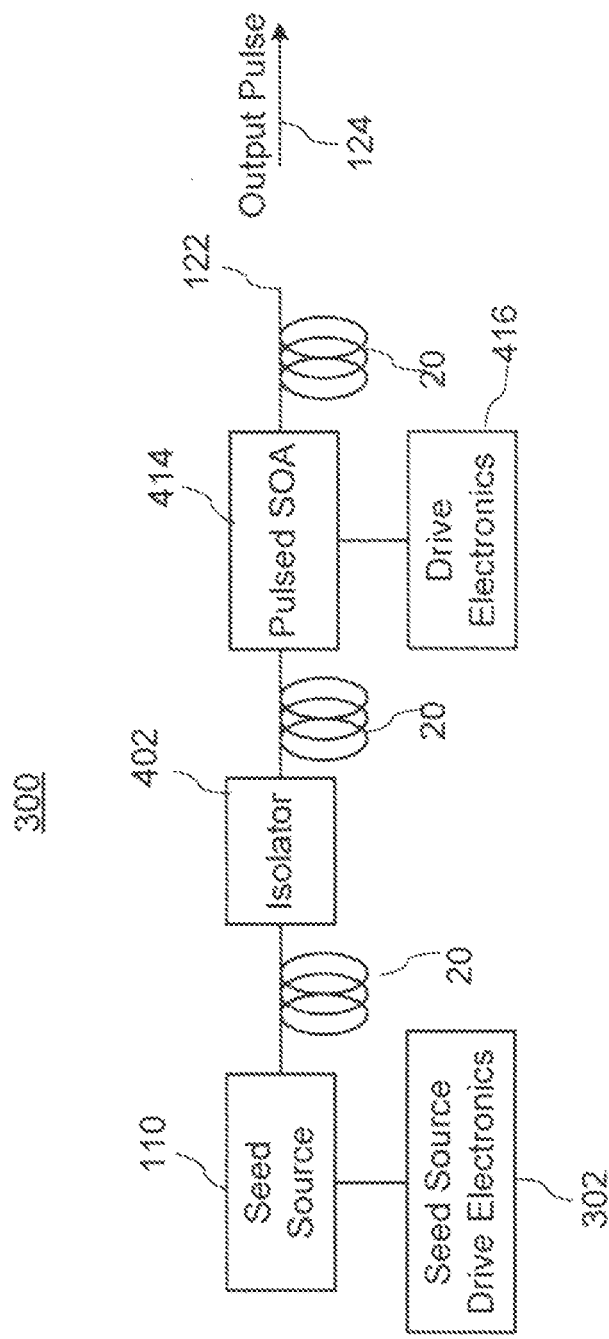
FIG. 8 is a schematic block diagram of an embodiment of the OPS of the present invention with an in-line pulsed SOA.

With reference to FIG. 8, an OPS 300 is schematically illustrated according to an embodiment of the present invention, which utilizes an in-line pulsed SOA 414 to generate the output pulsed optical signal. In the shown embodiment, the SOA 414 is single-passed and is fiber coupled on both sides, with an input fiber port thereof coupled to the seed optical source 110 through an optional optical isolator 402. Such devices may not be as readily available as SOAs that are fiber-coupled on only one side, and they typically provide a lower output power. The single-pass SOA 414 may have both facets AR or UAR coated, or the facets may be angled with respect to the optical path. Since the SOA 114 is single-passed, the optical circulator 120 is not required. The SOA 414 may be embodied as a fiber-coupled tapered amplifier (TA), which can provide a higher output power than a conventional single-pass SOA. The optional optical isolator 402 is coupled between the pulsed SOA 414 and the seed source 110 to block back-reflections into the seed source 110 from the SOA 414 or from any other intervening optical elements that may be optionally provided in the optical pulse of the seed optical radiation.

Figure 9:
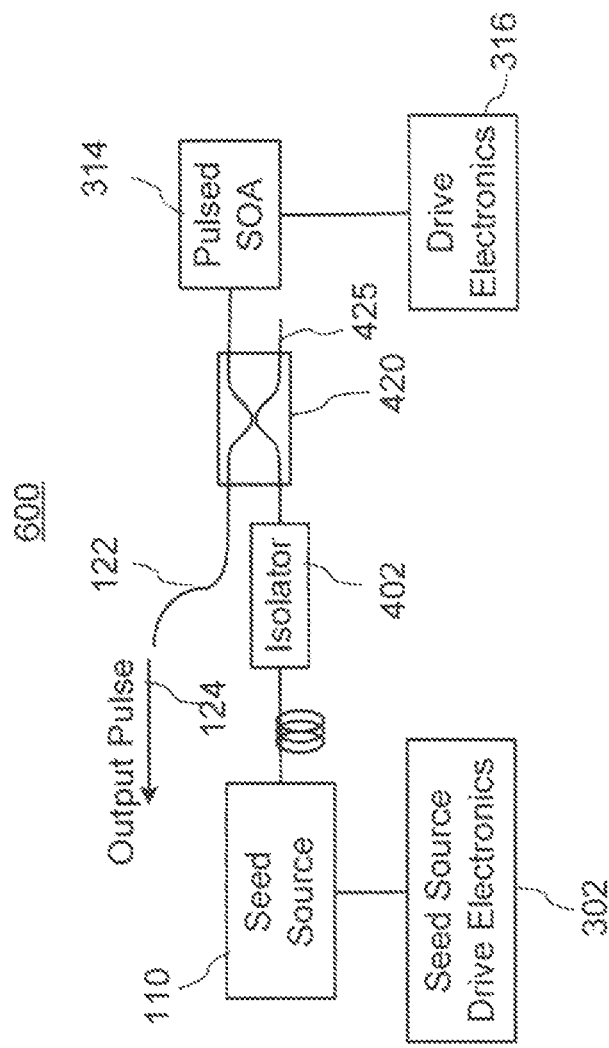
FIG. 9 is a schematic block diagram of an embodiment of the OPS of the present invention utilizing an optical coupler to couple light in and out of the POA.

Other coupling means for directing the seed optical radiation into the POA and for outputting the resulting pulsed optical signal from the POA may be used in embodiments of the invention. For example, the coupling means may be an optical coupler, such as a 3- or 4-port tap coupler that divides light input at one fiber into two output fibers with a given splitting ratio. FIG. 9 illustrates an exemplary OSP 600 having a four-port optical tap coupler 420 optically connecting the seed source 110 with the reflective pulsed SOA 314. For example, a 10:90 optical tap would couple 10% of the output optical power from the seed source 110 into the SOA 314 and 90% of the output power from the SOA 314 into the output fiber port 122. The 90% of the seed power that was not coupled into the SOA 314 could be available for monitoring on another port 425, and the 10% of the SOA output power that was not coupled out of the OSP 600 would be directed back toward the seed source 110; if this back-reflection is undesirable, an optical isolator 402 could minimize this feedback. An optional phase modulator and/or amplitude modulator may be disposed in the optical link between the seed source 110 and the tap coupler 420. The tap coupler 420 may be a fused-fiber component, or it may be constructed from discrete components, that may be in a fiber-coupled package. Tap couplers may employ polarization-maintaining or non-polarization-maintaining fiber. Some tap couplers provide a variable splitting ratio, which could be useful for system optimization. If a tap coupler is used, optical isolators may or may not be required depending on the exact implementation of the seed source. If the seed source 110 is an ASE source or a laser diode, isolation is likely required to prevent feedback from causing unintentional lasing in the ASE source or spectral instability in a laser diode.

Although the preceding exemplary embodiments generally illustrate main features of the present invention, other embodiments may utilize additional optical components as desired for particular applications.

Figure 10:
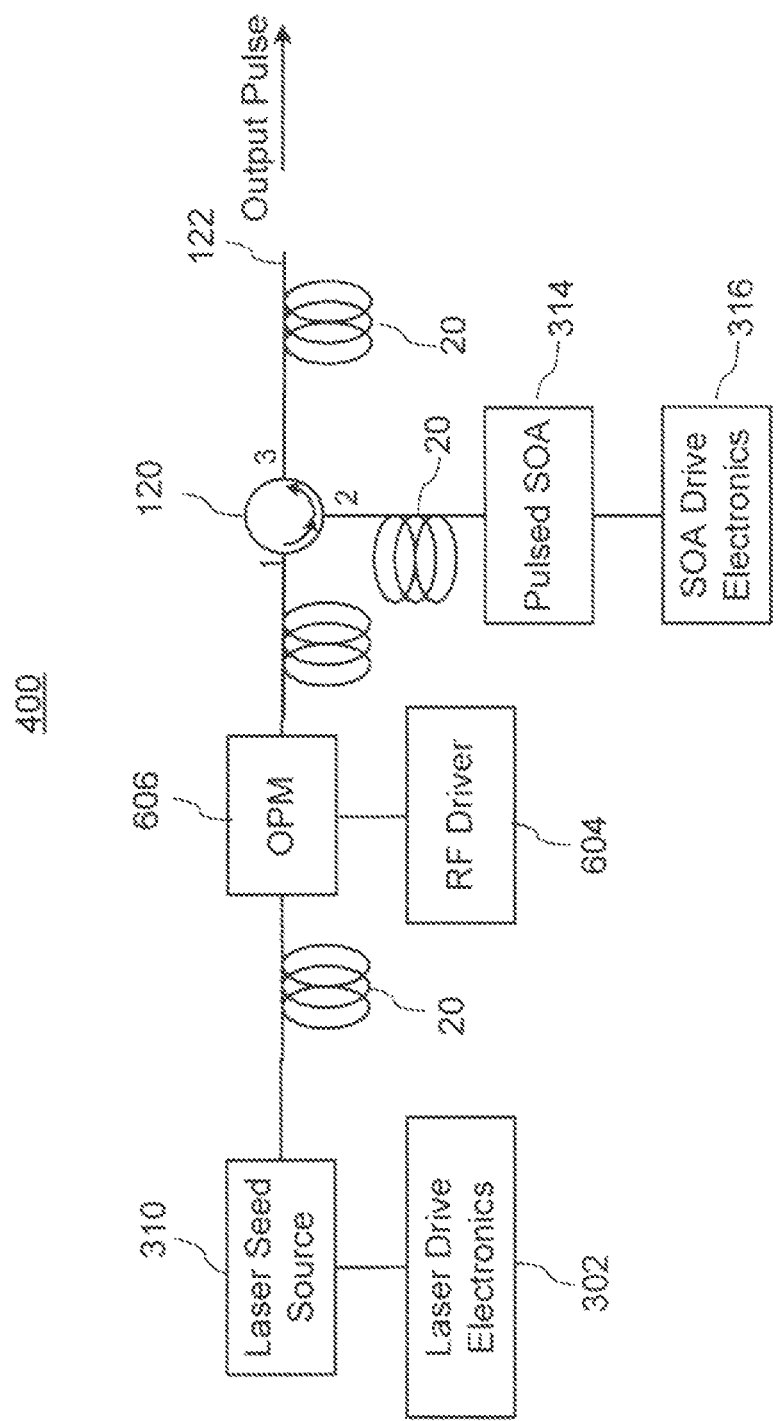
FIG. 10 is a schematic block diagram of an embodiment of the OPS of the present invention incorporating an optical phase modulator.

With reference to FIG. 10, a POS 400 is schematically illustrated according to an embodiment of the invention. The POS 400 may be viewed as an embodiment of the POS 200 utilizing an LD 310 as the optical seed source, and an in-line optical phase modulator (OPM) 606 that is driven by an RF driver 604 and is fiber-coupled in the optical path from the LD seed source 310 and the pulsed SOA 314. The OPM 606 serves to broaden the optical spectrum of the optical seed radiation generated by the LD seed source 310, which may be desirable, for example, to increase the threshold of the non-linear stimulated Brillouin scattering (SBS) in a fiber amplifier that is seeded with the output optical pulse signal from the POS 400. The use of the OPM 606 may be particularly desired if the LD seed source is in the form of a single-frequency LD, such as an ECL, a DFB laser or a DBR laser, and if the desired pulse duration is greater than about 1-2 ns. The use of such single-frequency sources of the seed radiation may be advantageous for applications which require relatively narrow-bandwidth light. The single-frequency seed source may have lower amplitude noise than the ASE sources, which are typically characterized by high amplitude noise, particularly at frequencies in the GHz range and beyond. On the other hand, the use of the ASE based seed sources offers a very short optical coherence length that can be advantageous in some systems.

Examples of suitable single frequency lasers that can be used in this embodiment include External Cavity Lasers such as the LU1064 'yy' series available from Lumics, Distributed Bragg Reflector diode lasers such as the PH1064 DBR laser manufactured by Photodigm, and Distributed Feed Back (DFB) lasers such as the EYP-DFB-1064-00040-1500-BFY02 manufactured by Eagleyard. These lasers are conveniently packaged in a standard 14-pin butterfly packages characterized by a relatively high electrical bandwidth, which allows direct modulation of the laser seed radiation to reduce cw leakage through the SOA as described hereinabove. In other embodiments may utilize single-frequency, fiber-based laser such as a NP Photonics RFLM-100-1-1550.92.

For such single-frequency lasers, which typically have a spectral width of less than 1 GHz and as low as few MHz, the OPM 606 may be driven by the RF driver 604 so as to broaden the optical spectrum of the optical seed radiation from the LD seed source 310 to about 10 GHz or beyond, as may be desired for the SBS suppression. This may be achieved by a suitable selection of a phase modulation depth and/or modulation frequency, as known in the art.

Figure 11:
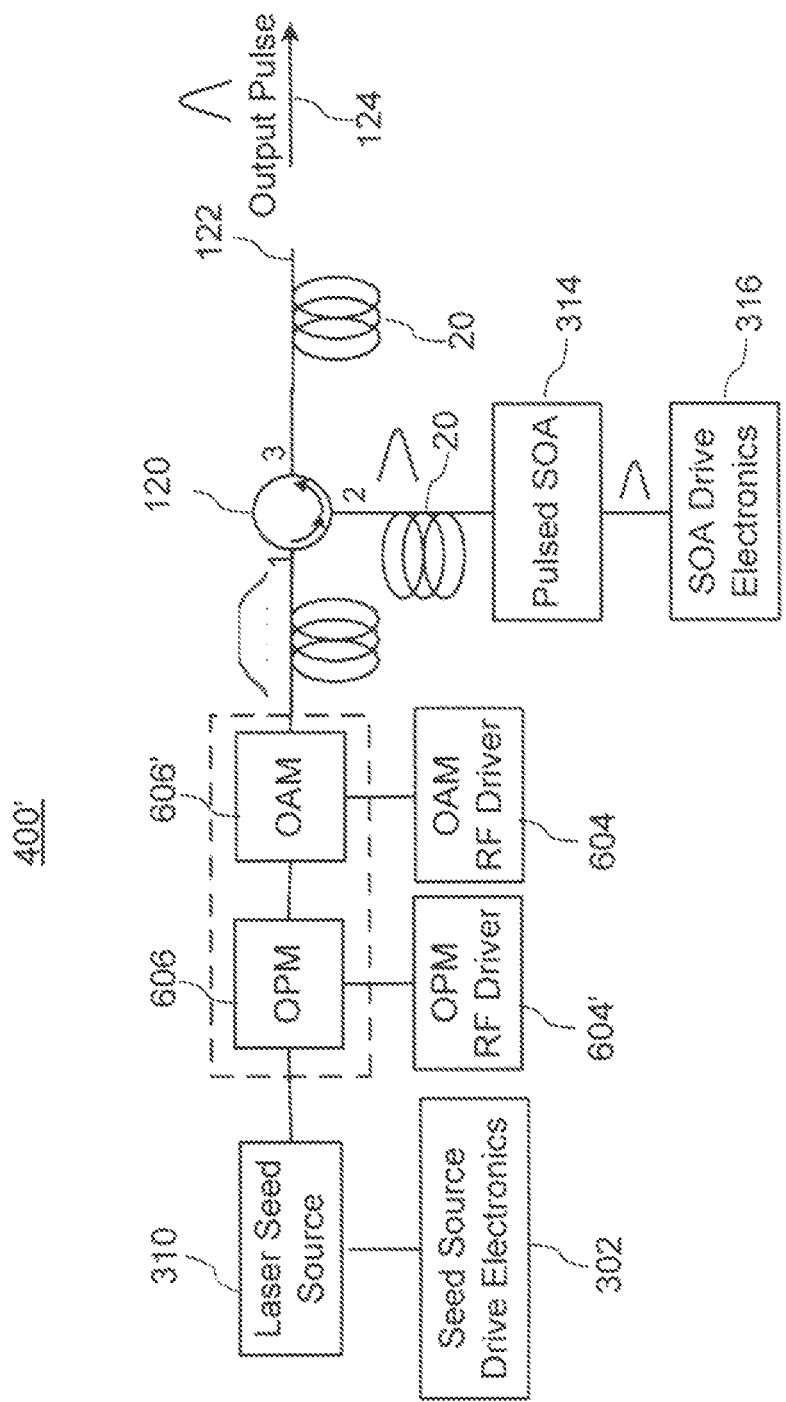
FIG. 11 is a schematic block diagram of an embodiment of the OPS of the present invention incorporating an optical phase modulator and an amplitude phase modulator between an optical seed source and a circulator.

In some embodiments of the invention, an optical amplitude modulator (OAM) may be provided in addition to the OPM 606, in order to provide additional suppression of the out-of pulse optical radiation, i.e. of the optical radiation that enters the SOA 314 in-between the electrical pulses 713 that drive the SOA. One such embodiment is illustrated in FIG. 11, showing a POS 400' having the OPM 606 and the OAM 606' in the optical path between the laser SOS 310 and the optical circulator 120. The OPM 606 and the OAM 606' may be embodied in a single chip, as schematically illustrated in FIG. 11 with a dashed box. The OAM 606' may be driven by an electrical OAM driver 604' which electrical circuitry may be distinct from that of the OPM RF driver 604.

Figure 12:
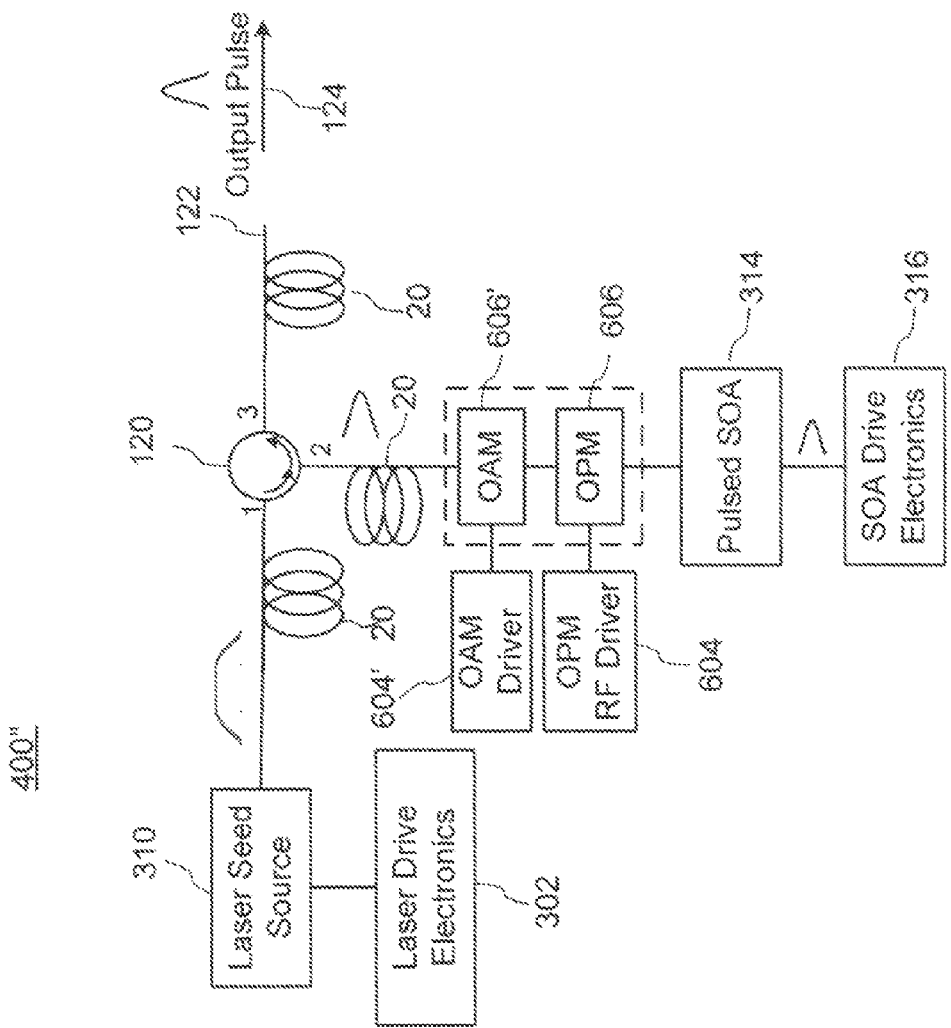
FIG. 12 is a schematic block diagram of an embodiment of the OPS of the present invention incorporating an optical phase modulator and an amplitude phase modulator between a circulator and the POA.

The OPM 606, and the optional OAM 606', may be disposed either at Port 1 of the optical circulator 120 as illustrated in FIGS. 10 and 11, or at Port 2 of the optical circulator 120, as illustrated in FIG. 12. In a POS 400" of FIG. 12, wherein the OPM 606 is disposed in the optical path between the optical circulator 120 and the pulsed SOA 314, the OPM 606 is double-passed by the optical signal, which may increase its effectiveness.

The OPM 606 may be embodied, for example, as a lithium niobate waveguide electro-optic phase modulator as known in the art. Alternatively, it may be embodied using a semiconductor-based phase modulator, which are also known in the art. Similarly, the OAM 606' may be in the form of a lithium niobate waveguide electro-optic amplitude modulator or a semiconductor-based modulator. In one embodiment, the OAM 606' may share the same waveguide chip as the phase modulator 606. A waveguide optical amplitude modulator can typically be modulated at higher rates than the pulsed SOA 314, and as such it can be used to enhance the pulse shaping provided by the pulsed SOA 314, for example to steepen the rising edge of the pulse, to shorten the pulse duration, or to further enhance an extinction ratio of the output optical pulses 714.

Figure 13A:
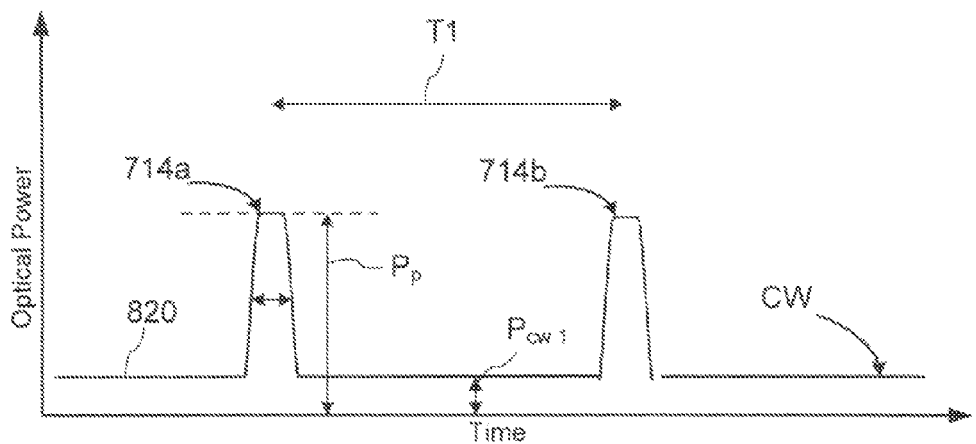
FIG. 13A and 13B is a schematic diagram illustrating the use of a variable cw power offset in the semiconductor POA for maintaining a constant output optical power for a variable pulse repetition rate operation.

The concept of the pulse extinction ratio, or in other words the extinction ratio of optical pulses, can be understood with reference to FIG. 13A, illustrating output optical pulses 714a and 714b with a peak power $P_p$ at the output port 3 of the circulator 120. If the seed radiation input into the SOA 314 is not modulated, it may leak through to the output of the SOA 314 even when no electrical current is driven therethrough, i.e. outside of the time intervals $\tau_{SOA}$ illustrated in FIG. 7, in the form of a cw output power $P_{cw}$. The pulse extinction ratio E is defined as the ratio of the optical peak power to the optical cw power, $E=P_p/P_{cw}$. Preferably, the SOA 314 is selected so that the pulse extinction ratio E at its output is at least 20 dB, and preferably as high as 30 dB to 40 dB and greater, for at least one polarization of the light input therein. However, the pulse extinction ratio at the output of the SOA 314 is polarization-dependent, and may be much lower for a certain undesired input polarization. Advantageously, the use of the circulator 120, or generally of any other suitable polarization-selective, optically isolating device such as the optical isolator 402, in the optical link between the seed optical source 110 or 310 and the SOA 314, preferably in combination with polarization-maintaining fibers, enables to suppress the undesired polarization of the seed radiation at the input of the SOA 314, thereby enhancing the pulse extinction ratio at the output thereof. As a further advantage, the optical circulator 120 further suppresses the undesired polarization of the light emitted by the SOA 314 as it propagates between the circulator's ports 2 and 3, thereby further increasing the pulse extinction ratio E at the output port 3 of the circulator 120. We found that output pulse extinction ratios as high as or greater than 50 dB can be obtained.

Maintaining the pulse extinction ratio of the output pulse optical signal 124 as high as possible may be desirable for some applications, in particular when the output pulses 714 are emitted with a constant repetition rate. In other embodiments it may be desired to drive a low-level cw pump current thought the SOA 314 in-between the electrical pump pulses 713 so as to intentionally generate a cw optical power at the output of the SOA. In this mode, the SOA 316 may operate as a variable optical attenuator, letting therethrough a variable portion of the input seed radiation depending on the SOA electrical drive current. This functionality of the SOA 314 can be advantageously used when it is desirable to have bursts of optical pulses separated by extended periods wherein no pulses is emitted, or generally when pulses with a varying repetition rate are desired. In application wherein the pulse optical signal 124 is coupled into downstream fiber amplifiers, it may be desirable to maintain a constant average optical power of the output optical pulse signal 124. The downstream fiber amplifiers may operate best at a constant average power input; otherwise the downstream fiber amplifiers may need to have their own pumps modulated in order to prevent excess energy storage, self-lasing, and potential damage to the system. By varying the cw electrical drive current into the SOA 316 when the pulse repetition rate R is varied, the average output optical power from the POS of the present invention can be maintained at a constant level. Here, the term "average optical power", when used to refer to a pulsed optical signal, is understood as an optical power of the pulsed optical signal that is averaged over a time interval that is several times greater than time intervals between individual optical pulses.

Figure 13B:
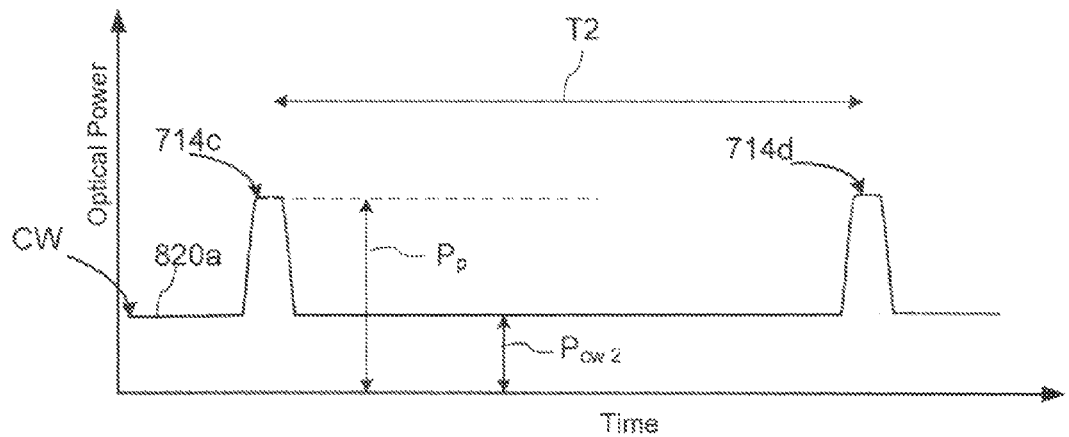

By way of example, FIGS. 13A and 13B illustrate increasing the output cw optical power from a lower value $P_{cw1}$ to a higher value $P_{cw2}$ when the time interval between consecutive output optical pulses 714a, 714b, 715c and 714d is increased from a lower time interval $T_1$ to a relatively higher time interval $T_2$, so that the average optical power of the pulsed output signal 124 over many pulse intervals can be maintained.

For example, in a burst mode of operation the SOA 314 is injected with a low-level cw electrical current in-between the bursts, which is chosen so that the output cw optical power $P_{cw}$ from the POS matches the average output optical power $P_{av}=(P_p \cdot \tau_{SOA} \cdot R)$ that is injected in the downstream amplifier during the pulsing bursts with the burst pulse repetition rate R, so that the downstream amplifiers maintain a time-averaged constant input and output power level.

The ability to easily provide a constant average output optical power for a varying pulse repetition rate advantageously distinguishes embodiments of the present invention from many alternative approaches to optical pulse generation. For example, controllably reducing an output power of a single pulsed DBR or DFB laser by 20 or 30 dB from a peak operating condition can be difficult, forcing the laser to operate near the lasing threshold, wherein its output power is highly sensitive to current fluctuations. Furthermore, operation in that regime may significantly change the optical spectrum, which is undesirable. Contrary to that, the use of the SOA 314 in the current embodiments enables one to maintain the output spectrum close to the optical spectrum of the seed radiation at any level of the SOA injection current, so that the output spectrum remains largely unchanged between the pulsed operation and the low-level CW operation.

Figure 14:
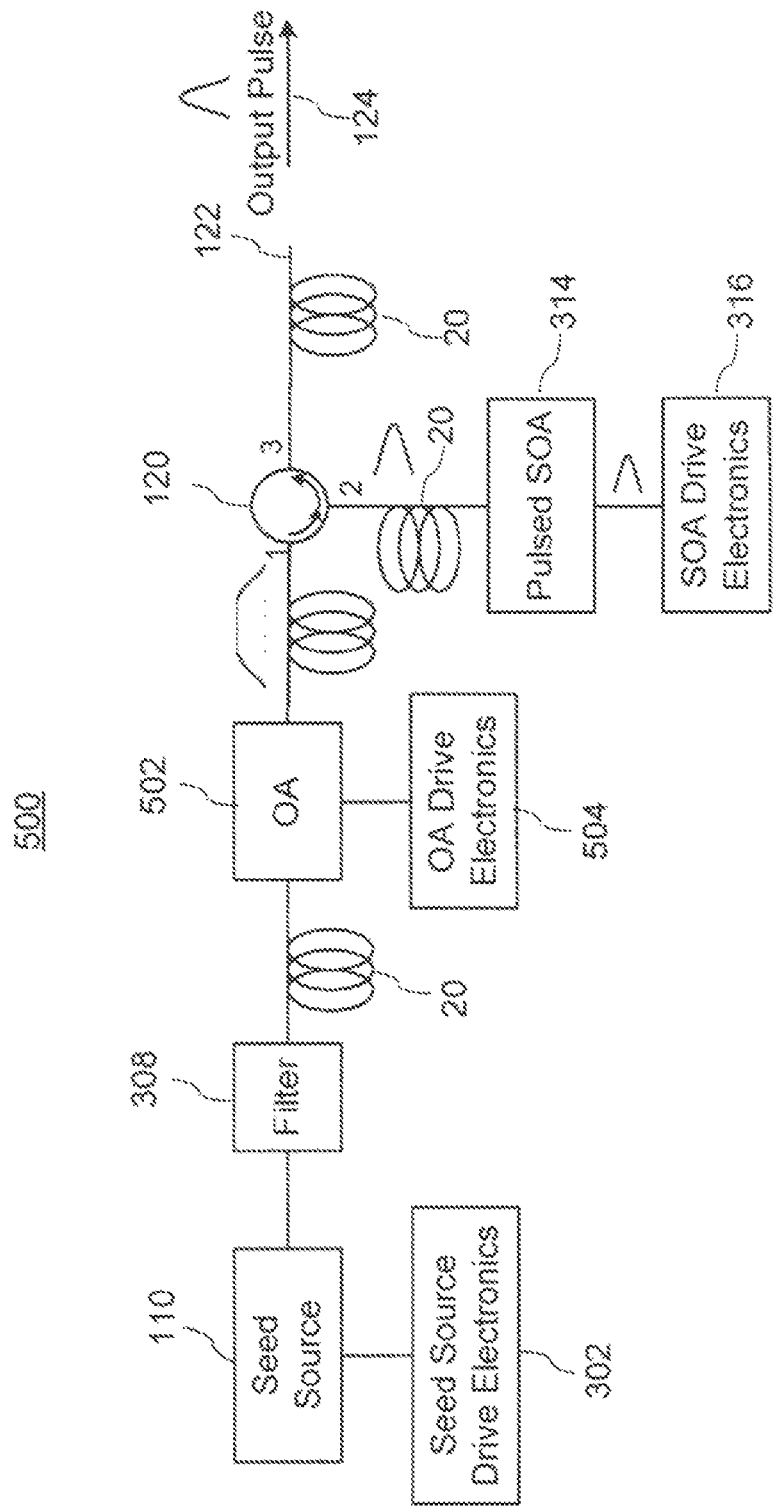
FIG. 14 is a schematic block diagram of an embodiment of the OPS of the present invention incorporating a pre-amplifier.

With reference to FIG. 14, a POS 500 is schematically illustrated according to yet another embodiment of the present invention. The POS 500 may be viewed as a variant of the POS 200 that utilizes an in-line optical amplifier (OA) 502 electrically driven by an OA driver 504 and is fiber-coupled in the optical path from the optical seed source 110 to the pulsed SOA 314 using optical fibers 20. The OA 502 may be in the form of a SOA or a fiber amplifier, and serves as a pre-amplifier to increase the optical power of the optical seed radiation at the input of the pulsed SOA 314. The seed source 110 may be laser-based or ASE based, for example as described hereinabove. In an embodiment wherein the seed source 110 is ASE-based and employs an OA for generating the optical seed radiation 111 in the form of ASE, the SS driver 302 is for driving an optical pump of the OA in the seed source 110, such as the pump 212 in FIGS. 3 and 4, and may include suitable circuitry for pulsing the pump, which will be known to those skilled in the art. The optical pump may be in the form of one or more pump laser diodes or LEDs, in which case the SS driver 302 is substantially an LD driver that is capable of generating electrical drive pulses of suitable amplitude and duration, which may be longer than the duration of the output optical pulses emitted by the pulsed SOA 314, and therefore require relatively low-bandwidth electrical circuitry compared to that of the SOA driver 316.

Advantageously, the aforedescribed embodiments enable the generation of optical pulses at substantially any desired wavelength at which optical seed sources exist, such as in the wavelength range at or near 1064 nm, with a pulse duration that is variable in a wide range, for example, in the range from about 0.1 to 100 ns, which is of practical interest for seeding optical pulse sources based on optical amplifiers. The output pulse duration can be varied simply by varying the duration of electrical pulses driving the pulsed optical amplifier 114 (314, 414), which can be accomplished using relatively simple conventional electrical driving circuitry as known to those skilled in the art. Furthermore, the optical spectrum profile of the output pulse signal 122 is established separately and independently on the time profile thereof, by selecting suitable seed sources 110 and optionally employing suitable optical filters either within the SOS 110, or in the optical path from the SOS 110 to the POA 114 (SOA 314), and may be tunable such as by tuning the optical filters. Furthermore, the SOS 110 may be either operated in the cw regime or may be modulated at a sufficiently slow rate so that the output optical spectrum of the SOS 110, which substantially defines the optical spectrum profile of the output optical signal 122, does not change during the output optical pulse when the POA 114 (pulsed SOA 314) amplifies the light passing therethrough, and is substantially independent of the pulse duration of pulses in the output pulse signal 122. The output optical power of the OPS according to the present invention is determined primarily by the optical power at the output of the POA 114 (SOA 314, 414), and may be made relatively high, for example by employing a high output power double-pass or tapered SOA. By way of example, output peak powers up to and in excess of 500 mW are achievable with SOAs that are currently commercially available. Furthermore, the pulse repetition rate of the output pulses of the OPS of the present invention may also be easily varied in a wide range, with repetition rates in excess of 1 MHz easily achievable.

Advantageously, using a SOA as the POA 114 enables to utilize the gain saturation in the SOA for suppressing temporal fluctuations of the optical power of the seed optical signal 111 at frequencies up to several GHz, and thereby obtaining more stable output pulse signal 124, in terms of pulse shape and pulse amplitude thereof. As one skilled in the art will appreciate, when a SOA is fed with an input optical signal of sufficient optical power, for example in the 1 to 10 mW range, and the SOA is biased to a suitable small-signal gain, for example in the 20 to 30 dB range, the optical gain in the SOA is saturated, i.e., the single-pass gain is reduced from the unsaturated small-signal value due to limitations on overall energy extraction from the SOA, so that, e.g. a 5% increase in the input optical power into the SOA leads to a much smaller relative increase in the output optical power of the SOA, for example <1%. As the results, power fluctuations at the output of the SOA are substantially reduced in a frequency range of up to several GHz. This suppression of intensity fluctuations may be especially valuable when the input signal to the POA 114 comes from an ASE source as described hereinabove or a multi-longitudinal-mode laser. Both an ASE source and a multi-longitudinal-mode laser may exhibit large intensity fluctuations across a range of frequencies that depend on the wavelength spectrum of the source. When the radiation from the SOS 110 utilizing an optical source with large intensity fluctuations is amplified by the SOA 114 or 314 operating in the saturation regime, the magnitude of those fluctuations can be reduced, resulting in improved pulse stability and cleaner pulse envelopes as compared to the seed optical radiation 111.

When the pulsed SOA 114 or 314 operates in the saturation regime as described hereinabove, additional spectral filtering after passage through the SOA 114 can re-introduce the amplitude noise, if such filtering results in a disproportional suppression of spectral components of the output pulse signal 113 that carry a significant portion of the output optical power. Therefore, such additional in-band spectral filtering should be avoided in applications wherein stable optical pulses with low amplitude noise are desired.

Indeed, the amplitude noise suppression process in the SOA that is caused by gain saturation modifies the amplified radiation passing through the SOA in such a manner that subsequent spectral filtering can increase the noise level. Specifically, amplitude fluctuations in the input radiation cause modulation of the overall gain level in the saturated SOA, i.e., higher input power reduces the gain in the SOA. This modulated gain level is then experienced by all of the optical frequencies undergoing amplification in the SOA. Fluctuations in the input radiation at one frequency can thus modulate the gain level at that frequency and induce anticorrelations between radiation components at different frequencies. These anticorrelations between the previously uncorrelated frequency components of the input light serve to reduce the overall amplitude fluctuation level. However, once the various components become correlated, removal of any of the amplified frequency components by subsequent spectral filtering will lead to an increase in the noise level and at least a partial undoing of the noise reduction effects of the saturated SOA. The physics of this SOA-induced noise suppression and the impact of subsequent filtering has been described previously, see for example "Noise Suppression of Incoherent Light Using a Gain-Saturated SOA: Implications for Spectrum-Sliced WDM Systems", McCoy, et al, Journal of Lightwave Technology, Vol 23, pp 2399-2409 (2005). As a result, it may be desirable to minimize the degree of any subsequent in-band spectral filtering to minimize the increase in noise level. In practice, this may mean filtering out only the so called out-of-band wavelength radiation, such as background spontaneous emission from the SOA that is outside of the main spectrum of the optical seed radiation 111, but avoiding any in-band filtering of the pulse optical signal 113 and 124, i.e. any filtering or selective suppressing of radiation components thereof containing substantial power, that is of any spectral components of the output pulsed signal 113 that are within the bandwidth of the seed optical radiation 111.

Figure 15:
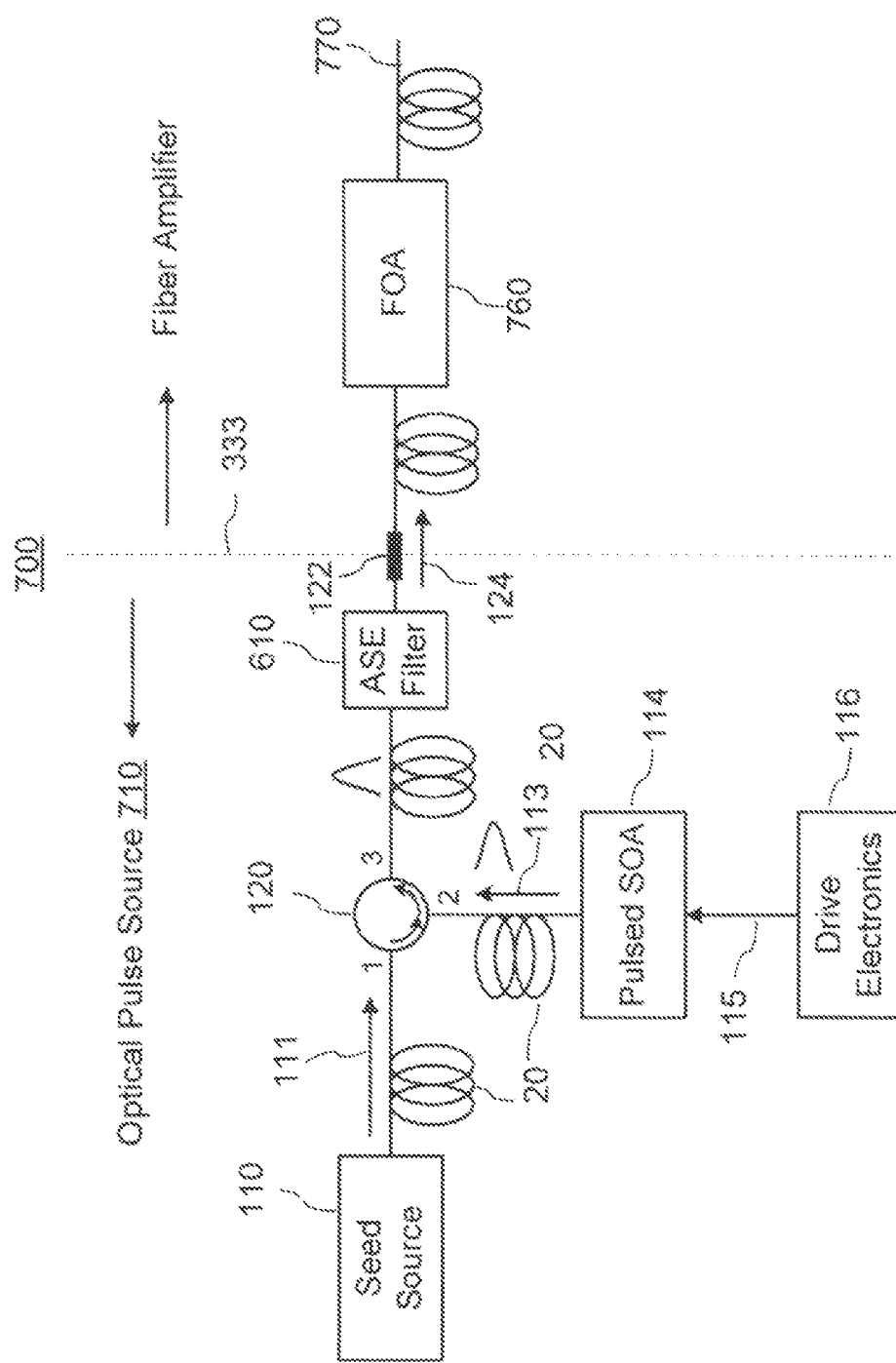
FIG. 15 is a schematic block diagram of a pulsed fiber amplifier system incorporating an embodiment of the OPS of the present invention with an output ASE filter.

The degree of this noise re-introduction depends on the degree of spectral filtering: the more power removed by any subsequent spectral filtering after the SOA 114, the higher the noise that may be introduced. Therefore, when using a saturated SOA to reduce the amplitude noise fluctuation level, it may be desirable to eliminate or minimize the degree of subsequent filtering. Some out-of-band spectral filtering may still be used to eliminate low-level emission from the SOA far outside the desired bandwidth to prevent detrimental effects in subsequent amplification stages With reference to FIG. 15, there is schematically illustrated a pulsed fiber amplifier system (PFAS) 700 according to an embodiment of the present invention. The PFAS 700 includes an OPS 710 having an output optical port 122 coupled to an input port of a fiber-optic amplifier system (FOA) 760. The FOA 760 may be formed of a single fiber amplifier, for example an EDFA with one or more pump laser diodes providing pump energy into a section of Erbium doped optical fiber, or a sequence of fiber amplifiers as known in the art. The OPS 710 generates the output optical pulse signal 124 seeding the FOA 760 with seed pulses 714, which are then amplified by the FOA 760 to generate high-power optical pulses at the output port 770 of the FAO 760. The OPS 710 may be viewed as an embodiment of the OPS 100, with an additional optical filter 610, which is also referred to herein as the ASE filter 610 for reasons explained hereinbelow, optically coupled between the output of the pulsed SOA 114 and the input to the FOA 760. For the sake of clarity and without imposing any substantive limitations we will consider the ASE filter 610 as being coupled within the OPS 710 at the output thereof, although physically it can also be positioned within the fiber amplifier portion of the PLS 700, while having the same functionality. The ASE filter 610 is used for suppressing out-of-band spectral components of the optical pulse signal 113 generated by the pulsed SOA 114. Accordingly, it may be in the form of an optical bandpass filter having a transmission bandwidth substantially matching, or somewhat exceeding, the spectral width of the seed optical radiation 110.

Figure 16:
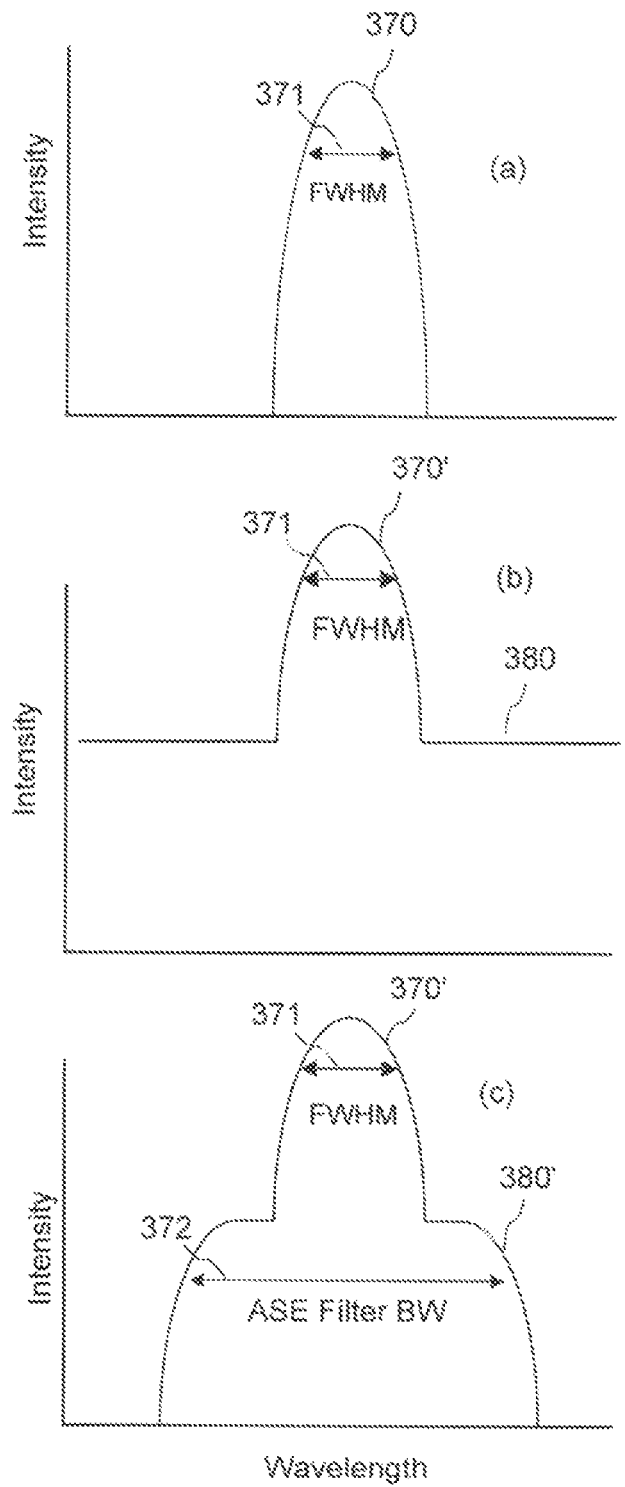
FIG. 16 is a schematic diagram illustrating the formation of an output optical spectrum of the OPS of FIG. 10.

With reference to FIG. 16, there is schematically illustrated the evolution of optical spectrum of light in the OPS 710 as it propagates from the SOS 110 to the output port 122. The SOS 110 emits seed optical radiation 111 with an optical spectrum having a desired optical spectrum profile 37 as schematically shown in FIG. 16(a), with a characteristic spectral width 371 defined for example as the full-width-at half-magnitude (FWHM) of the optical spectrum. The SOA 114 amplifies the seed optical radiation 111 in pulses of a desired duration, and also emits substantially broadband ASE radiation whose spectral width is defined by the gain properties of the SAO 114 and is generally much broader than the spectrum of the seed radiation 111. Accordingly, an optical spectrum of the optical pulse signal 113 generated by the SOA 114, which is schematically illustrated in FIG. 16(b), includes a central portion 307' substantially reproducing the optical spectrum profile 307 of the seed radiation 111, and a broad spectral pedestal 380 corresponding to the ASE generated by the SOA 114. An optical spectral profile of the output optical pulse signal 124, which is substantially the optical pulse signal 113 from the SOA 114 that is filtered by the ASE filter 610, is schematically illustrated in FIG. 16(c). As illustrated, the ASE filter 610 has a passband that is centered at a center wavelength of the optical spectral profile 370 of the seed radiation 111, and has a spectral width 372 that is slightly larger, e.g. by 25-100%, than the spectral width 371 of the seed radiation 111, so as to block most of the undesired out-of-band ASE radiation generated by the SOA 114 from entering the FOA 710.

Advantageously, the ASE filter 610, or any of other optical components that may be connected in the optical path between the SOA 114 and the FOA 710, does not change the relative strength of different "in-band" spectral components generated by the SOS 110, so that the output spectrum of the OPS 700 is substantially established by the selection of the SOS 110.

The invention has been described hereinabove with reference to exemplary embodiments thereof, but is not limited to the described embodiments, and numerous other embodiments and variants of the invention are possible, and an ordinary person in the art would be able to construct such embodiments without undue experimentation in light of the present disclosure. For example, although many of the embodiments described hereinabove include a three port optical circulator to direct light from the seed optical source through the pulsed optical amplifier to the output optical port, a four port optical circulator can also be used, for example terminating with a frequency selective reflector for shaping the optical spectrum of the seed optical radiation.

In another example, optical tap couplers can be used throughout the system for tapping of light for optical monitoring. In yet another example, an optical amplifier can be connected at the output of the pulse optical source of any of the FIGS. 1, 5-10 to further amplify the pulsed optical signal generated by the pulsed optical amplifier 114, 314, etc. In embodiments that utilize a single-frequency laser as the seed optical source 110, a section of suitable optical fiber of a selected length can be introduced in the optical path after the pulsed optical amplifier to induce the nonlinear self-phase modulation of the pulsed optical signal 113 so as to broaden its optical spectrum, for example beyond 10 GHz, in order to prevent the light from experiencing the undesirable SBS in the following fiber amplification system. Of course numerous other embodiments are possible. It should also be understood that each of the preceding embodiments of the present invention may utilize a portion of another embodiment. The scope of the invention should, therefore, be determined with reference to the appended claims along with their full scope of equivalents.

We claim:

1. An optical pulse source comprising:
 a seed optical source for providing seed optical radiation;
 a pulsed optical amplifier (POA) optically coupled to the seed optical source for amplifying the seed optical radiation in dependence upon an electrical pulse signal applied thereto, and for producing a pulsed optical signal comprising optical pulses of a pulse duration defined by the electrical pulse signal, wherein the pulsed optical amplifier comprises a semiconductor optical amplifier (SOA);
 a POA controller for providing the electrical pulse signal to the pulsed optical amplifier;
 an optically isolating device disposed in an optical path between the seed optical source and the pulsed optical amplifier for preventing back reflections into the seed optical source; and,
 an output optical port for outputting the pulsed optical signal;

wherein the electrical pulse signal comprises pulses of electrical current for producing the optical pulses in the output pulse signal, and a variable cw electrical current for varying an optical absorption of the SOA in-between the electrical current pulses, and wherein the POA controller is configured for varying the cw electrical current when a pulse repetition rate of the electrical current pulses is varied for maintaining a constant average optical power of the output pulse signal.

2. The optical pulse source of claim 1, wherein the optically isolating device comprises an optical circulator for coupling the seed optical radiation into the pulsed optical amplifier, and for coupling the pulsed optical signal from the pulsed optical amplifier to the output optical port.

3. The optical pulse source of claim 1, wherein the pulsed optical signal at the output port has an optical spectral shape that is defined substantially by the seed optical source, and has a temporal pulse shape that is defined substantially by the POA controller.

4. The optical pulse source of claim 1, wherein the seed optical source is for operating at an output power level of the seed optical radiation that saturates the SOA.

5. The optical pulse source of claim 1, wherein the pulsed optical amplifier comprises a double-pass semiconductor optical amplifier (SOA).

6. The optical pulse source of claim 1, wherein the pulsed optical signal at the output port has a spectral width that is substantially same as a spectral width of the seed optical radiation.

7. The optical pulse source of claim 1, wherein the seed optical source comprises an electrical drive circuit for pulsing the seed optical radiation synchronously with the electrical drive signal of the pulsed optical amplifier for enhancing an optical pulse extinction ratio of the pulsed optical signal.

8. The optical pulse source of claim 1, wherein the optical seed source comprises a source of amplified spontaneous emission (ASE).

9. The optical pulse source of claim 1, wherein the optical seed source comprises a laser.

10. The optical pulse source of claim 1, wherein the optical seed source comprises a single-frequency semiconductor laser diode, further comprising an optical phase modulator disposed in the optical path between the seed optical source and the pulsed optical amplifier for broadening an optical spectrum of the seed optical radiation to a desired spectral width.

11. The optical pulse source of claim 10, further comprising an optical amplitude modulator disposed in the optical path between the seed optical source and the pulsed optical amplifier for modulating an optical power of the seed optical radiation synchronously with the electrical pulse signal driving the pulsed optical amplifier.

12. The optical pulse source of claim 10, wherein the optical phase modulator comprises a waveguide electro-optic modulator.

13. The optical pulse source of claim 10, wherein the optical phase modulator and the optical amplitude modulator each comprises a waveguide electro-optic modulator.

* * * * *